US010274850B2

United States Patent
Ota (10) Patent No.: US 10,274,850 B2
(45) Date of Patent: Apr. 30, 2019

(54) IMPRINT APPARATUS AND METHOD OF MANUFACTURING ARTICLE

(71) Applicant: CANON KABUSHIKI KAISHA, Tokyo (JP)

(72) Inventor: Shunsuke Ota, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/667,927

(22) Filed: Aug. 3, 2017

(65) Prior Publication Data
US 2018/0059557 A1   Mar. 1, 2018

(30) Foreign Application Priority Data
Aug. 24, 2016   (JP) .................................. 2016-164027

(51) Int. Cl.
| G01B 11/00 | (2006.01) |
| G03F 9/00 | (2006.01) |
| B29C 43/58 | (2006.01) |
| G03F 7/00 | (2006.01) |
| H01L 21/302 | (2006.01) |

(52) U.S. Cl.
CPC ............ *G03F 9/7069* (2013.01); *B29C 43/58* (2013.01); *G03F 7/0002* (2013.01); *G03F 9/7042* (2013.01); *B29C 2043/5808* (2013.01); *B29C 2043/5816* (2013.01); *B29C 2043/5875* (2013.01); *H01L 21/302* (2013.01)

(58) Field of Classification Search
CPC ............ B29C 43/58; B29C 2043/5875; B29C 2043/5816; B29C 2043/5808; G03F 9/7069; G03F 9/7042; G03F 7/0002; H01L 21/302
See application file for complete search history.

(56) References Cited

U.S. PATENT DOCUMENTS

| 9,023,432 | B2 * | 5/2015 | Kawamura | G03F 7/0002 |
| | | | | 427/510 |
| 9,606,431 | B2 * | 3/2017 | Kawaguchi | B29C 59/02 |
| 9,829,789 | B2 * | 11/2017 | Tanabe | G03F 7/0002 |
| 2005/0116370 | A1 * | 6/2005 | Ogino | B82Y 10/00 |
| | | | | 264/40.1 |
| 2007/0262049 | A1 * | 11/2007 | Miyajima | B29C 33/42 |
| | | | | 216/11 |
| 2009/0123590 | A1 * | 5/2009 | Komoriya | B29C 33/424 |
| | | | | 425/174.4 |

(Continued)

FOREIGN PATENT DOCUMENTS

JP   2004259985 A   9/2004

*Primary Examiner* — Isiaka O Akanbi
(74) *Attorney, Agent, or Firm* — Rossi, Kimms & McDowell LLP (57) ABSTRACT

An imprint apparatus which includes a plurality of stations in which an imprint material supplied to an imprint region on a substrate is formed using a mold and a pattern is formed in the imprint region. The imprint apparatus includes: a holder provided in each of the plurality of stations and configured to hold the substrate and to adjust a temperature of the substrate; and a controller configured to output a target value used to adjust the temperature to the holder in a station in which a pattern is formed in a substrate among the plurality of stations on the basis of a size of the imprint region and a temperature of the substrate.

24 Claims, 5 Drawing Sheets

(56) References Cited

U.S. PATENT DOCUMENTS

2010/0072649 A1\* 3/2010 Kawakami ............. B82Y 10/00
                                                    264/40.7
2011/0169181 A1\* 7/2011 Kawakami ............. B29C 33/58
                                                    264/40.5
2016/0031151 A1\* 2/2016 Tan ........................ B82Y 40/00
                                                    264/40.5

\* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

Imprinting technology is technology capable of forming a nano-scale fine pattern and is being put into practical use as one of nanolithography techniques for mass production of magnetic storage media and semiconductor apparatuses. Magnifications in molds or substrates using temperature control for the purpose of overlapping (patterns of) imprint regions on substrates need to be corrected (Japanese Unexamined Patent Application Publication No. 2004-259985).

As a conventional method of correcting a pattern magnification, a method of correcting a pattern magnification using thermal expansion of a substrate through temperature control for a substrate holding unit as illustrated in Japanese Unexamined Patent Application Publication No. 2004-259985 has been proposed.

An imprint apparatus has a cluster configuration in which a conveying mechanism of a substrate (and/or a conveying mechanism of a mold) is used by a plurality of imprint stations and thus throughput per unit floor area (footprint) can be improved. Here, simply and individually performing the above-described magnification correction in stations is not necessarily efficient.

SUMMARY OF THE INVENTION

An objective of the present invention is to provide an imprint apparatus which is advantageous, for example, in terms of efficiency associated with magnification correction.

An imprint apparatus serving as one aspect of the present invention is an imprint apparatus which includes a plurality of stations in which an imprint material supplied to an imprint region on a substrate is formed using a mold and a pattern is formed in the imprint region. The imprint apparatus includes: a holder provided in each of the plurality of stations and configured to hold the substrate and to adjust a temperature of the substrate; and a controller configured to output a target value used to adjust the temperature to the holder in a station in which a pattern is formed in a substrate among the plurality of stations on the basis of a size of the imprint region and a temperature of the substrate.

Further features of the present invention will become apparent from the following description of exemplary embodiments with reference to the attached drawings.

DESCRIPTION OF THE EMBODIMENTS

First Embodiment

Figure 1:
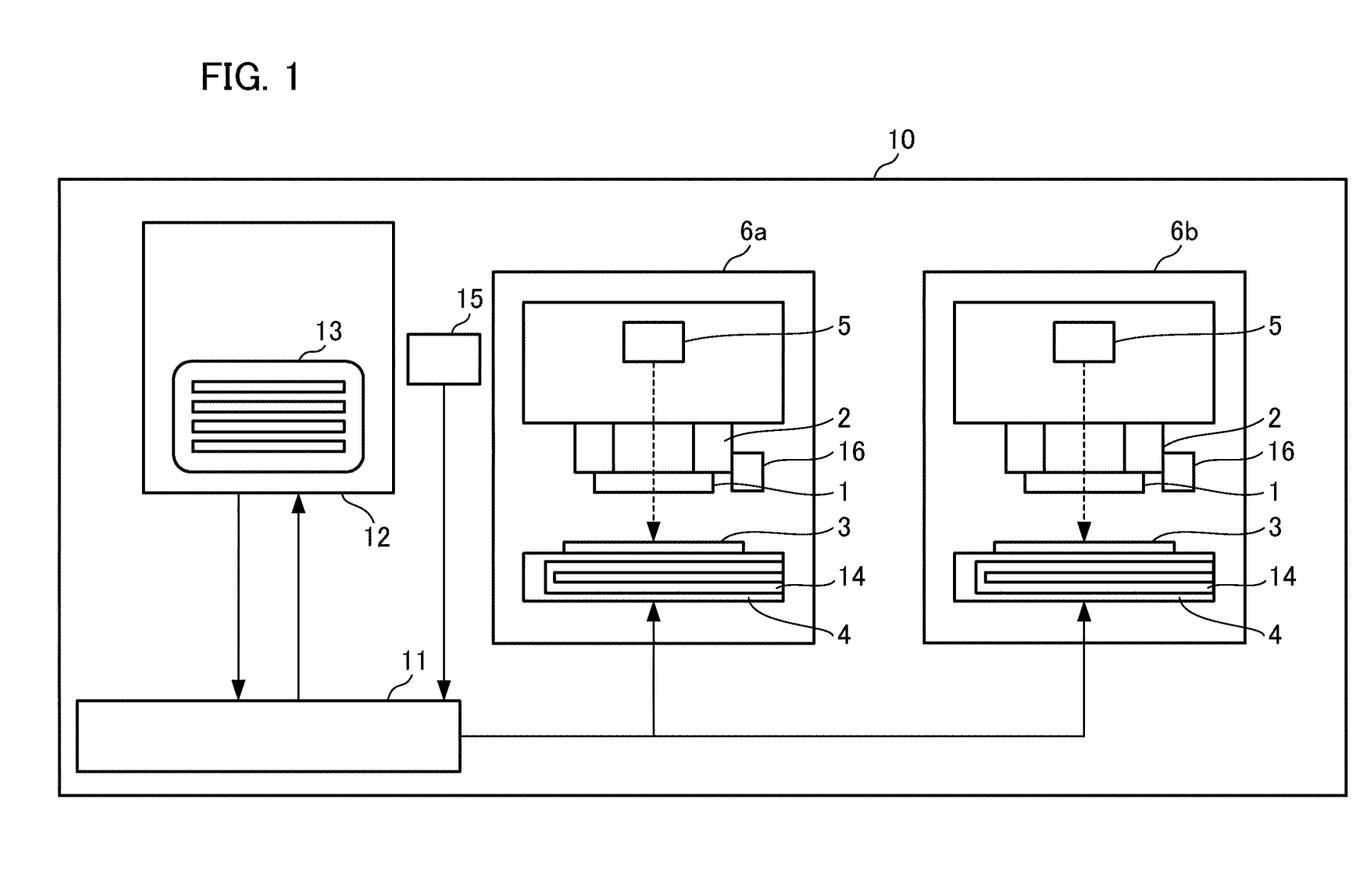
FIG. 1 is a diagram showing a configuration of an imprint cluster apparatus according to a first embodiment.

FIG. 1 is a diagram showing a configuration of an imprint cluster apparatus according to a first embodiment. An imprint cluster apparatus 10 in this embodiment includes a plurality of stations and each of the stations includes an imprint apparatus 6. The imprint cluster apparatus 10 further includes a conveying unit 12 configured to convey a substrate to the imprint apparatus, a measuring apparatus 15, and an imprint cluster control unit (hereinafter referred to as a "controller") 11 configured to control these. The imprint apparatus 6 is an apparatus used for manufacturing a semiconductor apparatus and the like, configured to form an imprint material (an uncured resin) on a substrate to be processed using a mold 1 with a pattern, and configured to perform an imprint operation of forming a pattern of an imprint material on an imprint region in the substrate. The measuring apparatus 15 is a measuring unit configured to measure a pattern magnification (a size of the imprint region) and a temperature of the substrate and to output measured results to a controller 11. For example, positions of a plurality of marks (alignment marks) formed on a substrate 3 are acquired using an alignment scope and the size of the imprint region is measured on the basis of the acquired results of the marks.

The imprint apparatus 6 includes a mold holder (a mold holding unit) 2 configured to hold the mold 1, a substrate holder (a substrate holding unit) 4 configured to hold the substrate 3, and a lighting system 5 configured to emit illumination light used to cure a resin during imprinting. The substrate holder 4 includes a temperature control liquid flow path 14 configured to adjust temperatures of the substrate holder 4 and the substrate 3. FIG. 1 illustrates an imprint apparatus 6a and an imprint apparatus 6b among the plurality of imprint apparatuses 6. The controller 11 outputs a temperature command for the substrate holder 4 and a command used to cause the conveying unit 12 to convey a substrate inside a substrate conveying container 13. A measuring apparatus 16 measures a temperature of the substrate holder 4 in the imprint apparatus 6 and outputs the measured results to the controller 11. Note that the temperature control liquid flow path 14 is illustrated as a temperature control means for controlling temperatures of the substrate holder 4 and the substrate 3, but the present invention is not limited thereto. A temperature control means which can control temperatures of the substrate holder 4 and the substrate 3 may be adopted.

Figure 2:
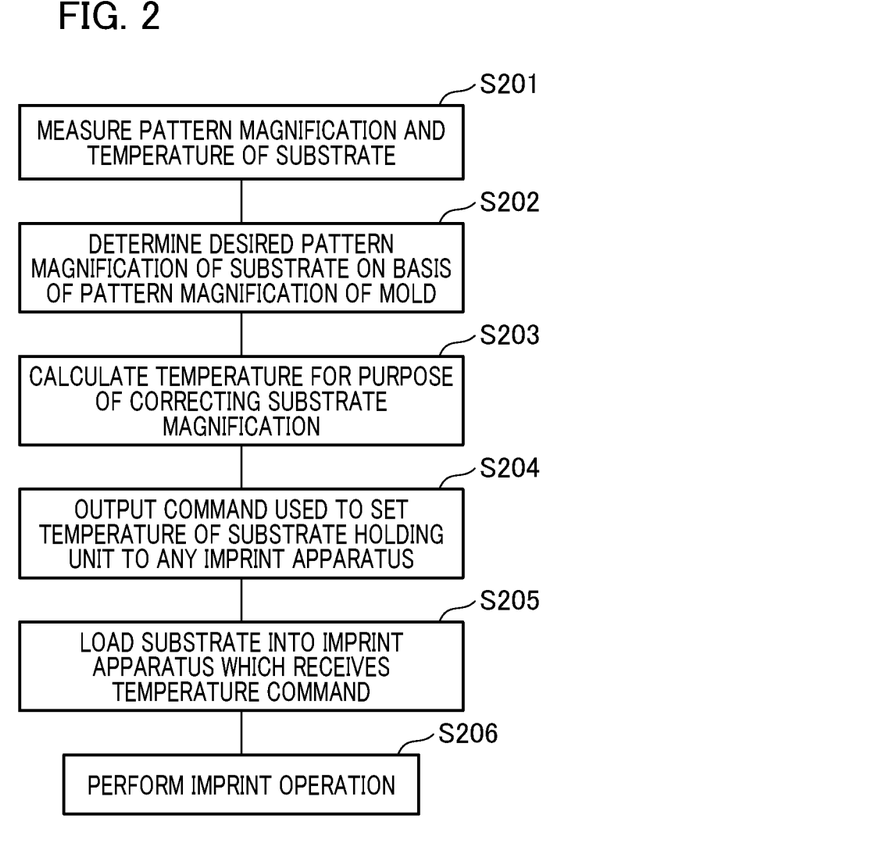
FIG. 2 is a flowchart for describing a magnification correcting method according to the first embodiment.

FIG. 2 is a flowchart for describing a procedure of a magnification correcting method according to the first embodiment. First, in Step S201, a pattern magnification (a size of an imprint region) and a temperature of the substrate 3 are measured by the measuring apparatus 15. In this embodiment, the pattern magnification corresponds to a size (a shape and a dimension) of an imprint region used to form a pattern. This maybe performed outside the imprint cluster apparatus and may be performed inside the imprint cluster apparatus. The controller 11 acquires measured results from the measuring apparatus. Subsequently, in Step S202, the controller 11 determines a desired pattern magnification (a size of an imprint region) of the substrate 3 on the basis of a size of a pattern in the mold 1. The desired pattern magnification corresponds to, for example, the size of the pattern of the mold 1.

In Step S203, the controller 11 calculates a substrate temperature serving as a desired pattern magnification on the basis of the pattern magnification and temperature information of the substrate 3 acquired in S201 and the desired pattern magnification determined in S202. To be specific, a temperature of the substrate 3 serving as a desired pattern magnification is calculated using a table storing physical property values of the substrate 3 and a coefficient of linear expansion and on the basis of the acquired pattern magnification (size of the imprint region) and temperature information of the substrate 3. Subsequently, in Step S204, the controller 11 outputs a command (a target value) used to set a temperature of the substrate holder 4 to any imprint apparatus in the imprint cluster apparatus 10. The substrate holder 4 adjusts a temperature in accordance with the command (the target value). In Step S205, the conveying unit 12 loads a substrate into the imprint apparatus which receives the temperature command. In the imprint apparatus into which the substrate is loaded, an imprint operation is performed in Step S206 so that the pattern of the mold 1 is transferred to the substrate 3 with an adjusted temperature and thus a pattern is formed.

As described above, according to this embodiment, a magnification can be simply corrected in the imprint cluster apparatus.

Second Embodiment

Next, a second embodiment will be described using FIG. 3. In the first embodiment, the object to which the controller 11 outputs the temperature command is only the substrate holder 4, but in a second embodiment, a temperature command (a target value) is output to a substrate holder 4 as well as a mold holder 2 and thus more precise magnification correction is performed. A configuration of an imprint cluster apparatus 10 in the second embodiment is the same as that in FIG. 1 in the first embodiment.

Figure 3:
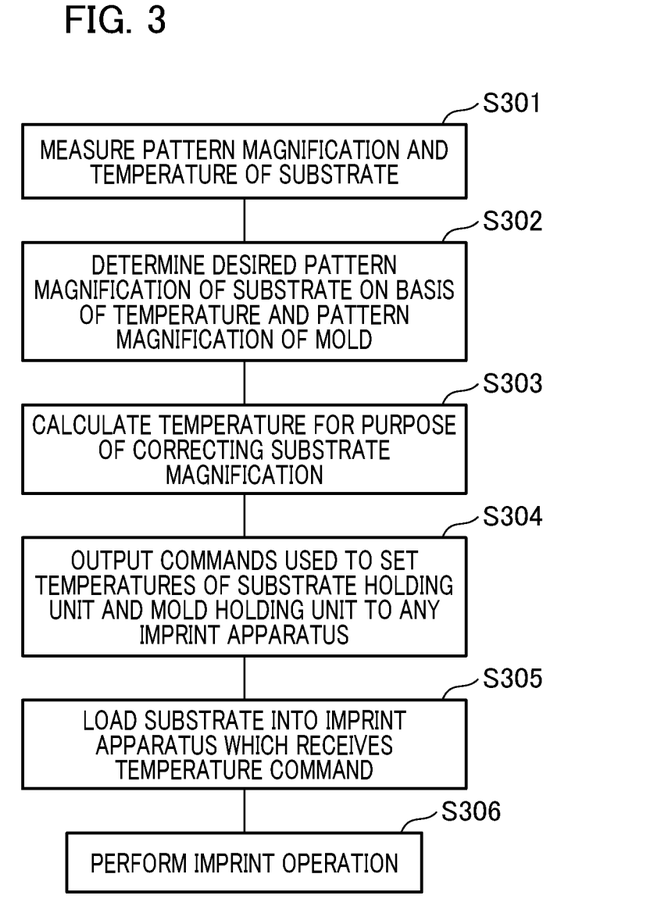
FIG. 3 is a flowchart for describing a magnification correcting method according to a second embodiment.

FIG. 3 is a flowchart for describing a procedure of a magnification correcting method according to the second embodiment. First, in Step S301, a pattern magnification (a size of an imprint region) and a temperature of the substrate 3 are measured by the measuring apparatus 15. Subsequently, in Step S302, the controller 11 determines a desired pattern magnification of the substrate 3 on the basis of a temperature and a pattern magnification (a size of an imprint region) of the mold 1. In Step S303, the controller 11 calculates temperatures of the substrate 3 and the mold 1 serving as the pattern magnification determined in S302 on the basis of a coefficient of thermal expansion of the substrate 3, the magnification and temperature information acquired in S301, and the pattern magnification of the substrate 3 determined in S302. Subsequently, in Step S304, the controller 11 outputs a command (a target value) used to set temperatures of the substrate holder 4 and the mold holder 2 to any imprint apparatus in the imprint cluster apparatus 10. The substrate holder 4 and the mold holder 2 adjust the temperatures in accordance with the command (the target value). In Step S305, the conveying unit 12 loads a substrate into the imprint apparatus which receives the temperature command. In the imprint apparatus into which the substrate is loaded, an imprint operation is performed in Step S306 so that the pattern of the mold 1 is transferred to the substrate 3 and thus a pattern is formed.

Here, in Step S304, the temperature of the mold 1 and the temperature of the substrate 3 are adjusted to the same temperature so that a temperature change due to thermal conduction when the mold 1 comes into contact with the substrate 3 can be eliminated and thus an error for a magnification correction of the transferred pattern can be reduced. Note that, since materials of the mold 1 and the substrate 3 are normally different, even when the temperatures of the mold 1 and the substrate 3 are the same, if there is a difference with a temperature when a pattern magnification is measured due to a difference in coefficient of thermal expansion, pattern magnification can be corrected.

Third Embodiment

Figure 4:
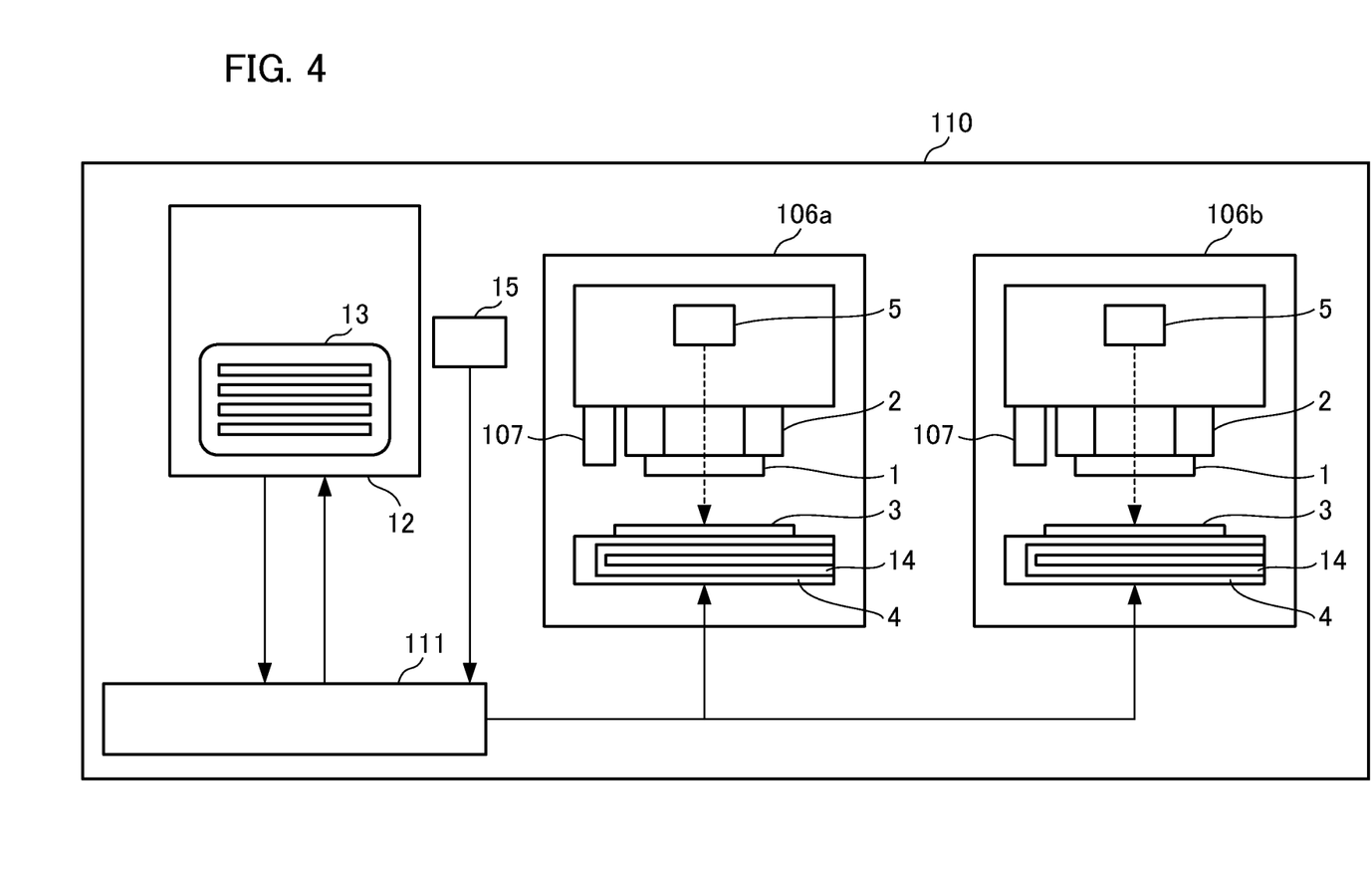
FIG. 4 is a diagram showing an imprint cluster apparatus according to a third embodiment.

Next, a third embodiment will be described using FIG. 4. Note that constituent elements which are the same as those in the case of the first embodiment are denoted in this embodiment with the reference numerals used above. In addition, detailed description thereof will be omitted and differences therebetween will be mainly described. Imprint apparatuses 106a and 106b included in an imprint cluster apparatus 110 include supply mechanisms 107 configured to supply (apply) an imprint material (a resin) to substrate 3. Each of the supply mechanisms 107 has a configuration serving as an adjusting unit (a first adjusting unit) which can adjust a temperature of the imprint material. A controller 111 outputs commands (target values) used to set temperatures of mold holders 2, substrate holders 4, and the supply mechanisms 107 and a command used to cause a conveying unit 12 to convey each substrate conveying container 13 configured to accommodate a substrate or a plurality of substrates inside the substrate conveying container 13.

With regard to a procedure of a magnification correcting method in the third embodiment, only differences between the third embodiment and the second embodiment will be described. In the second embodiment, a pattern magnification (a size of an imprint region) and a temperature are measured by a measuring apparatus 15 for each substrate. On the other hand, in this embodiment, only a pattern magnification (a size of an imprint region) and a temperature of a representative substrate inside a substrate conveying container 13 are measured. This is because pattern magnifications and temperatures of other substrates inside the substrate conveying container 13 are also measured if it is assumed that substrates inside the substrate conveying container 13 have the same pattern magnification and temperature and only the representative substrate is measured. Moreover, in the case of loading of substrates by the conveying unit 12, each substrate is not loaded, and substrates in each substrate conveying container 13 are loaded into imprint apparatuses.

Also, in the second embodiment, temperatures of a substrate and a mold are changed so that a magnification is corrected. On the other hand, in this embodiment, temperatures of a substrate and a mold are changed and temperature adjustment and application pattern adjustment in the supply mechanisms 107 made of a resin mentioned in this embodiment are performed. A temperature of an imprint material supplied onto a substrate is adjusted to, for example, the same temperature as the substrate 3 and the mold 1 so that temperature change due to thermal conduction can be eliminated and thus an error for magnification correction of a transferred pattern can be reduced. A control command from the controller 111 to the supply mechanisms 107 is sent, for example, when the controller 111 outputs a temperature command to the substrate holders 4 or the like.

In this embodiment, temperatures of a substrate and a mold are adjusted and temperature adjustment and application pattern adjustment of the supply mechanisms 107 are performed so that generation of a pattern error and a defect due to an influence of a temperature and viscosity of an imprint material can be reduced. Furthermore, a pattern magnification (a size of an imprint region) and a temperature of a representative substrate inside the substrate conveying container 13 are measured by the measuring apparatus 15, the substrate for each substrate conveying container 13 is loaded into each of the imprint apparatuses, and thus productivity can be improved.

Fourth Embodiment

Figure 5:
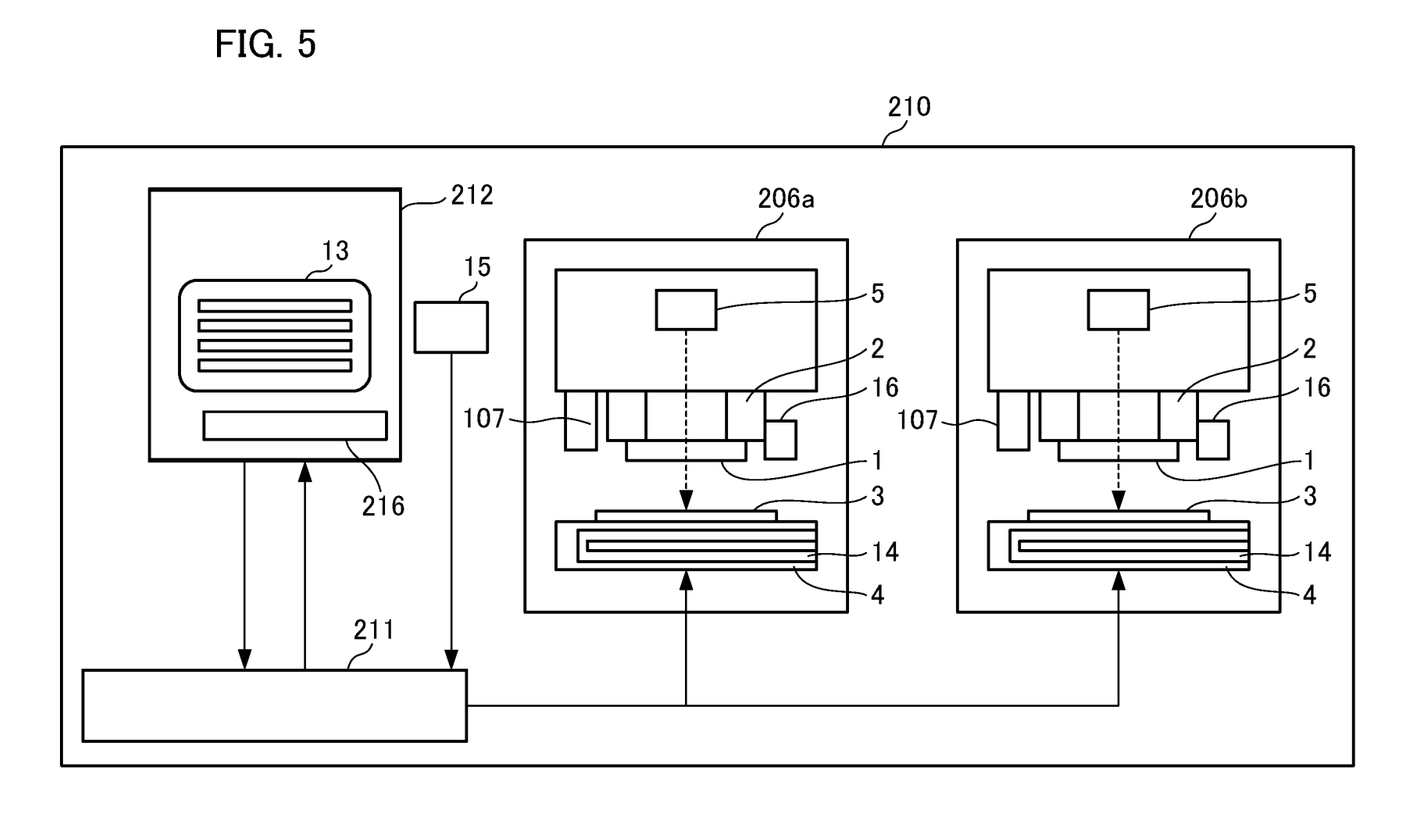
FIG. 5 is a diagram showing an imprint cluster apparatus according to a fourth embodiment.

Next, a fourth embodiment will be described using FIG. 5. Note that constituent elements which are the same as those in the case of the first embodiment and the third embodiment are denoted in this embodiment with the reference numerals used above. In addition, detailed description thereof will be omitted and differences therebetween will be mainly described. A conveying unit 212 included in an imprint cluster apparatus 210 in this embodiment includes a pre-adjusting unit 216 (a second adjusting unit) configured to perform temperature adjustment on substrates in advance. A controller 211 outputs temperature commands (target values) with respect to mold holders 2, substrate holders 4, and the pre-adjusting unit 216 and a command used to cause the conveying unit 212 having the pre-adjusting unit 216 for a substrate to perform loading for each substrate inside the substrate conveying container 13 or each substrate conveying container 13 including substrates.

When a temperature of the substrate 3 used to correct a substrate magnification is calculated, the controller 211 outputs a temperature command to the pre-adjusting unit 216 in addition to each of the mold holders 2 and each of the substrate holders 4. For example, a temperature command used to set the same temperature may be provided so that the mold holder 2, the substrate holder 4, and the pre-adjusting unit 216 have the same temperature. The pre-adjusting unit 216 receiving a temperature command adjusts temperatures of substrates inside the conveying unit 212 before the substrates or the substrate conveying container 13 including the substrates is loaded into the imprint apparatus.

In this embodiment, a temperature of a substrate is caused to approach a predetermined desired temperature using the pre-adjusting unit 216 so that time necessary for stabilizing a temperature in the substrate holder 4 can be shortened and thus productivity can be improved.

Fifth Embodiment

Next, a fifth embodiment will be described. A configuration of an imprint cluster apparatus in this embodiment is the same as that of the apparatus described using FIG. 5 in the fourth embodiment. In this embodiment, temperatures of substrate holders 4 in imprint apparatuses differ. A controller 211 selectively determines whether a substrate is conveyed to any substrate holder among a plurality of substrate holders and outputs a command to a conveying unit 212. Note that the controller 211 may output a temperature command (a target value) to each of the substrate holders 4 in advance so that temperatures of the substrate holders 4 in the imprint apparatuses differ.

The controller 211 acquires results of measuring a temperature and a pattern magnification (a size of an imprint region) of a substrate before the substrate is loaded into each of the imprint apparatuses from a measuring apparatus 15 and results of measuring temperatures of the substrate holders 4 inside an imprint cluster apparatus 210 from a measuring apparatus 16. At this time, the temperatures of the substrate holders differ. Moreover, the controller 211 selectively determines a substrate holder serving as a conveyance destination in which a substrate has a desired magnification on the basis of the acquired information. The controller 211 outputs a command used to cause the conveying unit 212 to convey each substrate inside a substrate conveying container 13 or each substrate conveying container 13 including substrates to the determined substrate holder.

According to this embodiment, since a conveyance destination advantageous for temperature adjustment can be determined from a plurality of substrate holders with different temperatures inside the imprint cluster apparatus, magnification correction in which time necessary for adjusting a temperature of a substrate has been shortened compared with a case in which temperature adjustment starts after a substrate has been conveyed can be performed and thus productivity can be improved. Note that, after temperature adjustment of a substrate is performed by the pre-adjusting unit 216 inside the conveying unit 212 so that the substrate has the same temperature as the determined substrate holder serving as a conveyance destination, conveying may be performed.

Embodiment According to an Article Manufacturing Method

A method of manufacturing an apparatus (a semiconductor integrated circuit apparatus, a liquid crystal display apparatus, and the like) serving as an article includes a step of forming a pattern in a substrate (a wafer, a glass plate, a film-like substrate) using the above-described imprint cluster apparatus. In addition, the method of manufacturing the apparatus may include a step of etching a substrate in which a pattern is formed. Note that, when other articles such as patterned media (recording media) and optical elements are manufactured, the method of manufacturing the apparatus may include another step of treating (processing) a substrate in which a pattern is formed instead of an etching step. A method of manufacturing an article in this embodiment is advantageous in at least one of performance, quality, productivity, and production cost for an article compared with the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, although an example in which two imprint apparatuses are provided in an imprint cluster apparatus has been described for simplicity of explanation, it is clear that the effects of the present invention can be obtained even when a configuration thereof is changed to a cluster configuration including three or more imprint apparatuses. Furthermore, the same effects can be obtained even when the same temperature command as a substrate holder and a mold holder is output to a plurality of imprint apparatuses inside an imprint cluster apparatus and substrates are loaded from the same substrate conveying container to imprint apparatuses and are subject to pattern transferring.

This application claims the benefit of Japanese Patent Application No. 2016-164027 filed on Aug. 24, 2016, which is hereby incorporated by reference herein in its entirety.

What is claimed is:
1. An imprint apparatus which includes a plurality of stations in which a pattern of an imprint material is formed in an imprint region on a substrate using a mold, the imprint apparatus comprising:
a holder provided in each of the plurality of stations and configured to hold the substrate and to adjust a temperature of the substrate; and
a controller configured to output a target value used to adjust the temperature to the holder in a station in which a pattern is formed in a substrate among the plurality of stations on the basis of a size of the imprint region and a temperature of the substrate.
2. The imprint apparatus according to claim 1, comprising:
a measuring unit configured to measure a size of an imprint region on a substrate,
wherein the controller outputs the target value on the basis of the size measured by the measuring unit.
3. The imprint apparatus according to claim 2, wherein the measuring unit measures the size on the basis of positions of a plurality of marks formed in the substrate.
4. The imprint apparatus according to claim 1, comprising:
a measuring unit configured to measure a temperature of the substrate,
wherein the controller outputs the target value on the basis of the temperature measured by the measuring unit.
5. The imprint apparatus according to claim 1, wherein the controller outputs the target value on the basis of temperatures of the holders in the plurality of stations as well.
6. The imprint apparatus according to claim 1, wherein a station in which a pattern is formed in a substrate is determined on the basis of the size, the temperature of the substrate, and temperatures of the holders in the plurality of stations.
7. The imprint apparatus according to claim 5, wherein the target value is output on the basis of a size of the mold as well.
8. The imprint apparatus according to claim 6, wherein the determination is performed on the basis of a size of the mold as well.
9. The imprint apparatus according to claim 1, comprising:
a mold holder configured to hold the mold and to adjust a temperature of the mold,
wherein the controller outputs a target value used to adjust the temperature of the mold to the mold holder.
10. The imprint apparatus according to claim 1, comprising:
a first adjusting unit configured to adjust a temperature of the imprint material,
wherein the controller outputs a second target value used to adjust the temperature of the imprint material to the first adjusting unit on the basis of the target value.
11. The imprint apparatus according to claim 1, comprising:
a conveying unit configured to selectively convey the substrate to the plurality of stations,
wherein the conveying unit includes a second adjusting unit configured to perform temperature adjustment on the substrate, and
the controller outputs a target value used to perform temperature adjustment to the second adjusting unit on the basis of the target value.
12. The imprint apparatus according to claim 6, comprising:
a conveying unit configured to selectively convey the substrate to the plurality of stations,
wherein the controller controls a conveyance destination of the conveying unit on the basis of the determination.
13. The imprint apparatus according to claim 11, wherein the conveying unit conveys a container configured to accommodate a plurality of substrates.
14. A method of manufacturing an article, the method comprising steps of:
forming a pattern in a substrate using an imprint apparatus including a plurality of stations in which a pattern of an imprint material is formed in an imprint region on a substrate using a mold; and
processing the substrate in which the pattern is formed in the forming step,
wherein the imprint apparatus includes:
a holder provided in each of the plurality of stations and configured to hold the substrates and to adjust a temperature of the substrate; and
a controller configured to output a target value used to adjust the temperature to a holder in a station in which a pattern is formed in a substrate among the plurality of stations on the basis of sizes of the imprint region and a temperature of the substrate.
15. An imprint apparatus comprising:
a measuring station including a measuring unit configured to measure a size of an imprint region on a substrate and a temperature of the substrate; and
an imprint station including a holder configured to hold a substrate on which a size of an imprint region has been measured by the measuring unit and of which a temperature has been measured by the measuring unit, and in which a pattern of an imprint material is formed in the imprint region on the substrate,
wherein the imprint station includes an adjusting unit configured to adjust a temperature of the substrate held by the holder in response to the size and the temperature measured by the measuring unit.
16. The imprint apparatus according to claim 15, wherein the adjusting unit is configured to adjust the temperature of the substrate so that the size of the imprint region becomes a target size.
17. The imprint apparatus according to claim 15, wherein the adjusting unit is configured to adjust the size of the imprint region and the temperature of the substrate.
18. The imprint apparatus according to claim 15, comprising:
a second imprint station including a second holder configured to hold a substrate on which a size of an imprint region has been measured by the measuring unit and of which a temperature has been measured by the measuring unit, and in which a pattern of an imprint material is formed in the imprint region on the substrate,
wherein the second imprint station includes a second adjusting unit configured to adjust a temperature of the substrate held by the second holder in response to the size and the temperature measured by the measuring unit.
19. The imprint apparatus according to claim 15, wherein the measuring unit is configured to measure the size on the basis of positions of a plurality of marks formed in the substrate.
20. The imprint apparatus according to claim 15, wherein the adjusting unit is configured to adjust the temperature of the substrate held by the holder in response to a temperature of the holder as well.

21. The imprint apparatus according to claim 15, wherein the adjusting unit is configured to adjust the temperature of the substrate held by the holder in response to a size of the mold as well.

22. The imprint apparatus according to claim 15, comprising:
a mold holder configured to hold the mold and to adjust a temperature of the mold in response to the size and the temperature measured by the measuring unit.

23. The imprint apparatus according to claim 15, comprising:
a first adjusting unit configured to adjust a temperature of the imprint material in response to the temperature measured by the measuring unit.

24. A method of manufacturing an article, the method comprising steps of:
forming a pattern in a substrate using an imprint apparatus including a station in which a pattern of an imprint material is formed in an imprint region on a substrate using a mold; and processing the substrate in which the pattern is formed in the forming step, wherein the imprint apparatus includes:

a measuring station including a measuring unit configured to measure a size of an imprint region on a substrate and a temperature of the substrate; and an imprint station including a holder configured to hold a substrate on which a size of an imprint region has been measured by the measuring unit and of which a temperature has been measured by the measuring unit, and in which a pattern of an imprint material is formed in the imprint region on the substrate, wherein the imprint station includes an adjusting unit configured to adjust a temperature of the substrate held by the holder in response to the size and the temperature measured by the measuring unit.

* * * * *